United States Patent
Thiagarajan et al.

(10) Patent No.: US 9,778,327 B2
(45) Date of Patent: Oct. 3, 2017

(54) METHODS AND APPARATUS FOR MAGNETIC SENSOR WITH INTEGRATED CALIBRATION MECHANISM

(71) Applicant: Texas Instruments Incorporated, Dallas, TX (US)

(72) Inventors: Ganesan Thiagarajan, Bangalore (IN); Arup Polley, Richardson, TX (US); Terry Lee Sculley, Lewisville, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 146 days.

(21) Appl. No.: 14/848,731

(22) Filed: Sep. 9, 2015

(65) Prior Publication Data

US 2017/0067980 A1    Mar. 9, 2017

(51) Int. Cl.
*G01R 35/00* (2006.01)
*G01R 33/09* (2006.01)
*G01R 33/00* (2006.01)

(52) U.S. Cl.
CPC ....... *G01R 33/093* (2013.01); *G01R 33/0035* (2013.01)

(58) Field of Classification Search
CPC  G01R 33/005; G01R 33/0029; G01R 33/093; G01R 33/0035
USPC ......................................................... 324/202
See application file for complete search history.

(56) References Cited

U.S. PATENT DOCUMENTS

| | | | |
|---|---|---|---|
| 6,933,868 B1 * | 8/2005 | Premy | G01R 31/3167 341/120 |
| 7,274,186 B2 | 9/2007 | Yakymyshyn et al. | |
| 7,321,226 B2 | 1/2008 | Yakymyshyn et al. | |
| 8,604,777 B2 | 12/2013 | Doogue et al. | |
| 8,825,426 B2 | 9/2014 | Chowdhary et al. | |
| 2008/0129281 A1 | 6/2008 | Lemp | |
| 2008/0129282 A1 | 6/2008 | Lemp | |
| 2013/0138372 A1 * | 5/2013 | Ausserlechner | G01R 15/207 702/65 |
| 2014/0204358 A1 | 7/2014 | Yang et al. | |

* cited by examiner

*Primary Examiner* — Reena Aurora
(74) *Attorney, Agent, or Firm* — John R. Pessetto; Charles A. Brill; Frank D. Cimino (57) ABSTRACT

Methods and apparatus for magnetic sensors and integrated calibration. In an example arrangement, a system includes a magnetic sensor configured to output a signal corresponding to magnetic fields; a calibration trace disposed proximal to the magnetic sensor; a controlled current source coupled to the calibration trace and configured to output a current resulting in a magnetic field output from the calibration trace; and a comparator coupled to the output signal from the magnetic sensor and to an expected signal. In the example arrangement, the comparator outputs a signal indicating whether the output signal from the magnetic sensor corresponds to the expected signal. Methods are also disclosed.

21 Claims, 6 Drawing Sheets

METHODS AND APPARATUS FOR MAGNETIC SENSOR WITH INTEGRATED CALIBRATION MECHANISM

TECHNICAL FIELD

The present application relates in general to the field of magnetic sensors and calibration, and in particular to methods and apparatus for in system or continuous magnetic sensor calibration.

BACKGROUND

Magnetic sensors come in various forms and have been in use for decades. Currently magnetic sensors are being integrated on an integrated circuit with other circuitry. Fluxgate sensors consist of magnetic cores wrapped with drive and sense wires. Hall Effect sensors are linear transducers commonly used to detect shaft rotations. Anisotropic magnetoresistance (AMR) sensors have varying resistance based on the angle of the magnetization. Giant magnetoresistance (GMR) sensing uses a quantum level effect observed in thin-film structures. Tunnel junction magnetoresistance sensors (TMR) operate based on the spin dependent tunneling of electron: through a thin, electrically insulating barrier layer. More recently, another type of sensor called extraordinary magnetoresistance (EMR) occurs in semiconductor-metal hybrid systems, where the resistance can change several orders of magnitude with the application of a magnetic field, thus providing a sensor.

The accuracy of magnetic sensors is dependent on various factors including temperature, process, aging, magnetic field orientation. The accuracy of the magnetic sensor can vary within the operational range, especially when the response is not linear with the magnetic field intensity. Traditionally, these variations are compensated for with various prior known approaches. The primary known method is to use a calibration procedure or process on the sensor. This calibration process may be a one-time calibration or the calibration can be periodic depending on the complexity of the calibration system, the ability to gain access to a sensor for calibration and the accuracy desired. Other known techniques include placing the sensor in close proximity to the source so that the predominant magnetic field is from the desired source. Another technique is to use stronger magnets to overcome fields from other sources, which increase cost and add their own variability from aging and temperature. In nearly all cases using prior known approaches, the magnetic sensor calibration is done while the sensor is off line, or the sensor may need to be physically moved. As more accuracy in magnetic sensing is required, the complexity and cost of the sensor calibration increases.

While each of the prior known approaches has provided some improvement, further improvements are still desirable. Methods and apparatus for calibrating the magnetic sensors accurately while the sensors are in use or are in place, and without significant added costs, are therefore needed.

A continuing need thus exists for methods and apparatus to calibrate magnetic sensors to increase the accuracy of the sensing operations, while maintaining or reducing system costs, and without increasing the size of the magnets or requiring removing the magnets or sensors from the system.

SUMMARY

The novel arrangements of the present application provide improved magnetic sensor calibration methods and apparatus. By providing a calibration trace proximal to a magnetic sensor, calibration of the magnetic sensor can be performed in-system and even while the magnetic sensor is in use. In certain arrangements that form aspects of the present application the calibration can be performed continuously to ensure the magnetic sensor is always calibrated.

In an example arrangement, a system includes a magnetic sensor configured to output a signal corresponding to magnetic fields; a calibration trace disposed proximal to the magnetic sensor; a controlled current source coupled to the calibration trace and configured to output a current resulting in a magnetic field output from the calibration trace; and a comparator coupled to the output signal from the magnetic sensor and to an expected signal. In the example arrangement, the comparator outputs a signal indicating whether the output signal from the magnetic sensor corresponds to the expected signal.

Use of the various arrangements of the present application provides methods and apparatus for accurately calibrating magnetic sensors in a system, or even while the magnetic sensors are in use, in sharp contrast to the calibration of magnetic sensors in prior known approaches. The novel features of the present application are relatively low in cost to implement and are compatible with magnetic sensors integrated in commercially available semiconductor processes and that are disposed within integrated circuits and/or integrated circuit packages.

BRIEF DESCRIPTION OF THE DRAWINGS

For a more complete understanding of the illustrative examples of aspects of the present application that are described herein and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the illustrative example arrangements and are not necessarily drawn to scale.

DETAILED DESCRIPTION

The making and using of various example illustrative arrangements that incorporate aspects of the present application are discussed in detail below. It should be appreciated, however, that the illustrative examples disclosed provide many applicable inventive concepts that can be embodied in a wide variety of specific contexts. The specific examples and arrangements discussed are merely illustrative of specific ways to make and use the various arrangements, and the examples described do not limit the scope of the specification, nor do they limit the scope of the appended claims.

For example, when the term "coupled" is used herein to describe the relationships between elements, the term as used in the specification and the appended claims is to be interpreted broadly, and while the term "coupled" includes "connected", the term "coupled" is not to be limited to "connected" or "directly connected" but instead the term "coupled" may include connections made with intervening elements, and additional elements and various connections may be used between any elements that are described as "coupled."

Figure 1:
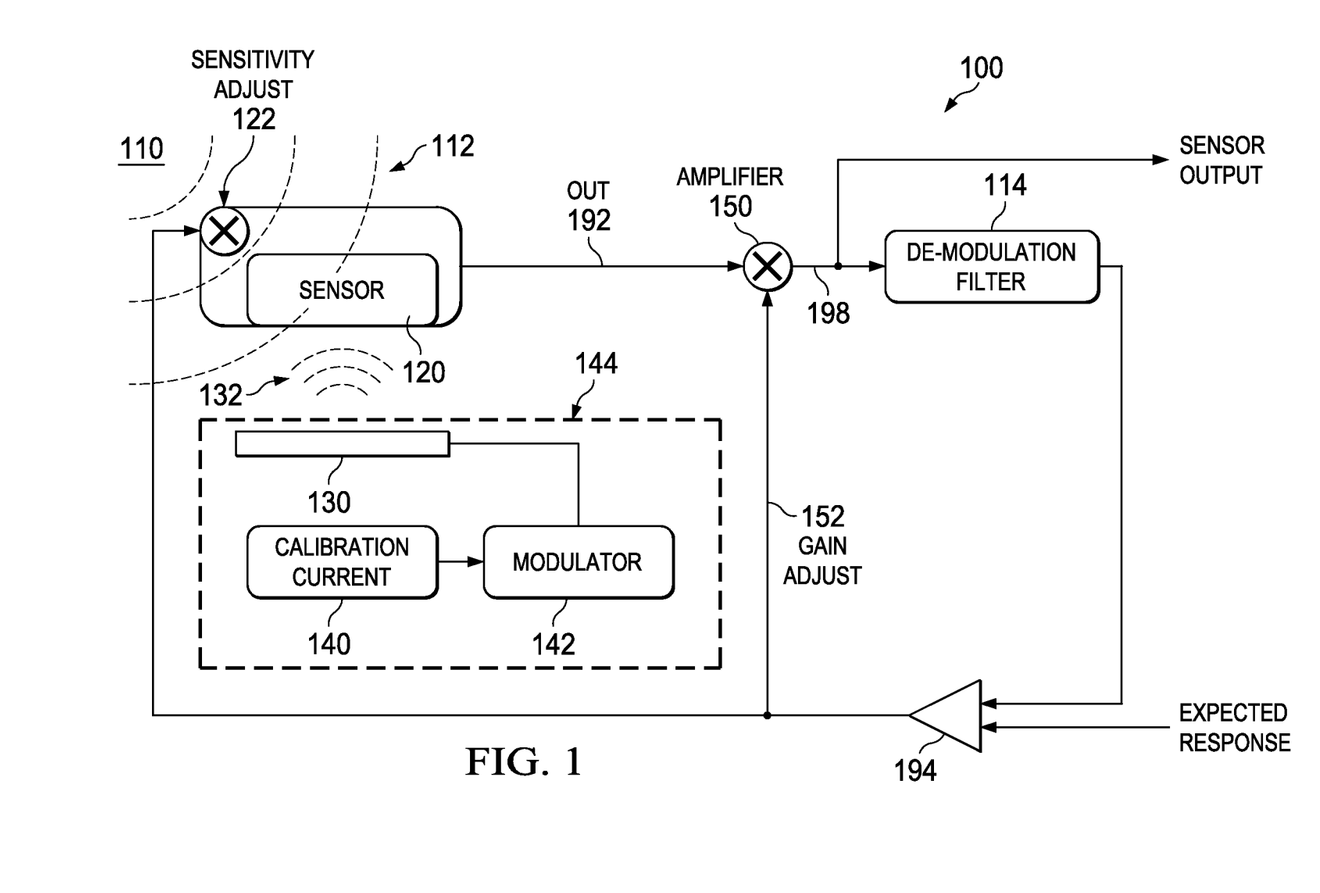
FIG. 1 is a block diagram illustrating an example arrangement for magnetic sensor calibration within a magnetic sensor system.

FIG. 1 is a block diagram illustrating an aspect of the present application within a magnetic sensor system 100. In system 100, a magnetic source 110 is shown with an electromagnetic field 112 crossing thru a magnetic sensor 120 which may have a sensitivity adjustment input 122. The magnetic sensor 120 can be, in non-limiting examples, a fluxgate sensor, or a Hall Effect sensor, for example. The arrangements described herein can be used with any magnetic sensor, including without limitation AMR, EMR, GMR, and TMR sensors. In some arrangements, a pair of sensors spaced by a distance between the two sensors is used to form the magnetic sensor 120. In these alternative arrangements, the pair of sensors can be integrated with other circuitry, for example, a pair of fluxgate sensors can be used in a CMOS semiconductor process. In an alternative arrangement a pair of Hall Effect sensors can be used. The magnetic sensor output OUT numbered 192 is coupled to an amplifier 150 with a gain adjustment input signal 152, and the output of the amplifier 198, which is the sensor output, is then coupled to a de-modulation filter 114 which is further coupled to a differential comparator 194. Calibration current 140 is coupled to a modulator 142 which is coupled to the calibration trace 130. The amplifier 150 with a gain adjust 152 is coupled to the demodulation filter 114 and receives the gain adjustment input 152 from the comparator 194. The amplifier produces sensor module output 198. For descriptive purposes, the calibration sub-system 144 includes the calibration trace 130, the calibration current source 140 and the calibration modulator 142.

In this example arrangement, the magnetic field 112 from a magnetic source 110, which could be a permanent magnet, electro magnet, the planet's magnetic field or any other source of a magnetic field to be monitored, such as a power line or other electromagnetic source, crosses the magnetic sensor 120. The magnetic sensor 120 outputs an electric signal OUT 192 based on the intensity of the magnetic field, the adjustment of the sensitivity input 122 and the output will have some variations based on environmental changes in the sensor due to, for example, temperature, pressure, and aging.

In an operation to calibrate the magnetic sensor 120, the calibration trace 130 is energized by a modulator 142, which is supplied by a precise current from calibration current source 140. The magnetic field 132 due to the calibration sub-system 144 is known and stable since its location and the supply currents are known. The calibration field 132 causes the magnetic sensor to output an electric signal OUT 192 that corresponds to the intensity of the calibration field 132 detected by the sensor 120. The output of the magnetic sensor corresponding to the magnetic field detected will vary with the adjustment of the sensitivity input 122 and environmental changes in the sensor 120 due to such factors as temperature and aging. With the sensitivity input fixed, the amount of output signal due to the calibration field 132 is known. The difference between the calibration signal and the expected signal is then due to environmental changes in the sensor such as temperature and aging. Using the comparator 194, the output of the magnetic sensor 120 can be dynamically adjusted to compensate for these inaccuracies by adjusting the sensitivity input 122, the gain adjust 152 or adjusting both until the output from the de-modulation filter 114 matches the expected response due to the calibration trace signal. In this manner the magnetic sensor 120 can be calibrated using the calibration trace.

In sharp contrast to the prior known approaches, continuous calibration of the magnetic sensor can be achieved by having the calibration sub-system active at all times. In that situation, the output signal 192 of the magnetic sensor 120 will contain a sum of signals due to both the calibration sub-system 144 and the magnetic source 110. The de-modulation block 114 filters out the calibration signal from the magnetic source signal, and the system then determines the signal variation due to environmental conditions in the comparator 194. The difference signal can be used to adjust the sensor output 198 to the corrected value by adjustment to the sensitivity input 122 or to the gain adjust 152 of the output amplifier 150, or to both. In this manner the calibration can be performed "in system" or "on-line", and can be performed even while the sensor continues to output sensed values due to the magnetic source 112. The magnetic sensor calibration can therefore be done continuously or at periodic intervals, as desired.

The calibration modulator 142 may employ any number of modulation techniques to produce a magnetic field that is not easily masked by field 112 from the magnetic source 110. Examples includes using a sine wave at a different frequency, or even a simple on/off modulation technique where the modulator sends a dc current for a specified time and then no dc current for another time. Implementation of the integrated calibration system 100 is contemplated as using an analog system, a digital system or a combination. Additionally, various levels of integration are contemplated by the present application, some which are described in the following figures. Existing commercial off the shelf solutions can be used to implement the calibration system 100. Alternatively, custom, semi-custom or ASIC integrated circuits can be used. Programmable devices for providing integrated circuit solutions, such as FPGAs, CPLDs, EEPROMs and the like can be used; alternatives include writing software for existing programmable devices such as microcontroller units (MCUs), central processor units (CPUs), digital signal processors (DSPs) and the like. A pair of sensors can be used to form the magnetic sensor 120, and can be integrated in a CMOS integrated circuit with additional circuitry, for example. Fluxgate sensor, Hall Effect sensors and other known magnetic sensors can be integrated with other circuitry on an integrated circuit to implement the system 100.

Figure 2:
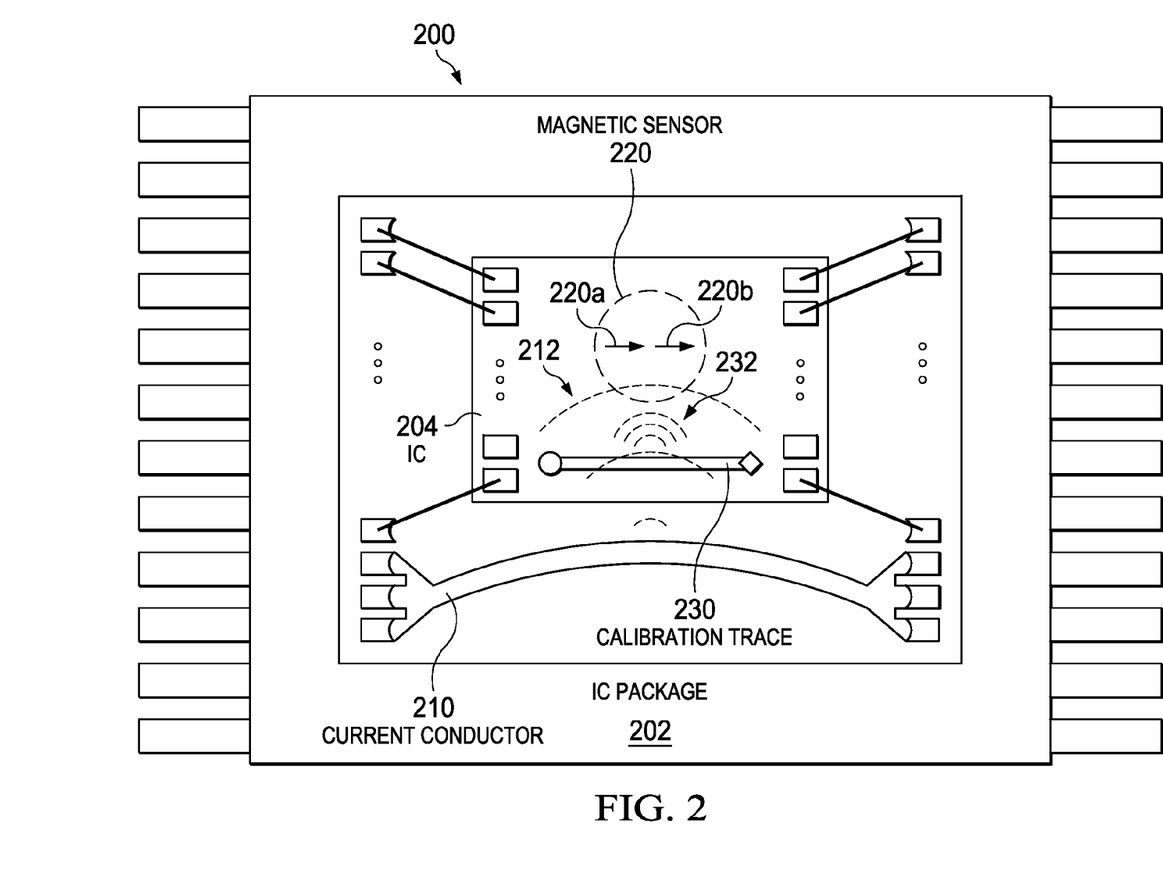
FIG. 2 depicts in a block diagram an example arrangement of the present application for a magnetic sensor and calibration trace disposed within an IC package with the current conductor integrated in the package.

FIG. 2 depicts an example arrangement of the present application where the sensor and the calibration trace are integrated within an IC package 202. In system 200, an IC package 202 contains an IC 204 and a measurement current conductor 210 which produces magnetic field 212 in response to an external electromagnetic field or a voltage or current applied to the current conductor 210, for example. Within the IC are a magnetic sensor 220 and a calibration trace 230 which produces a second magnetic field 232. In the non-limiting and illustrative example of FIG. 2, the magnetic sensor 220 includes a pair of sensors 220a, 220b, separated by a distance. Pairs of magnetic sensors can be used for position sensing, for example, using differential and common mode rejection circuitry. The pairs of sensors can be implemented using various magnetic sensors such as fluxgate sensors, Hall Effect sensors, and the like. Not shown in FIG 2, but integrated within the IC are the associated components from FIG. 1, including the calibration sub-system 144, de-modulation filter 114, differential comparator 194 and amplifier 150 with gain adjust. The magnetic sensor 220 can be implemented using pairs of Hall Effect sensors, or pairs of fluxgate devices, for example. An integrated circuit magnetic sensor using fluxgate technology is commercially available from Texas Instruments Incorporated, the owner of the present application; this part is referred to as the TI DRV421 "Closed-Loop, Current Sensing IC with Integrated Magnetic Fluxgate Sensor." The arrangements of the present application are not limited to any particular type of magnetic sensor, however. Hall Effect sensors and other sensors can be used for the magnetic sensor in the arrangements of the present application to form additional alternative arrangements that are contemplated as additional aspects of the present application, and which fall within the scope of the appended claims.

In the example system 200 shown in FIG. 2, the integration of the calibration trace 230 and the magnetic sensor 220 fix the spatial distance between them. By fixing this spatial distance, the magnetic field 232 generated by the calibration trace 230 is ensured to be consistent, and any variations observed in the calibration output signal from the magnetic sensor 220 are therefore due to external influences such as temperature and aging, and not from variance in the distance between the two components. The system 200 can be calibrated using the method described above with respect to FIG. 1, by applying a modulated signal to the calibration trace 230, de-modulating the responsive output signal from the magnetic sensor, comparing the output from the magnetic sensor to an expected result, and adjusting the sensitivity and/or amplifier gain to compensate the magnetic sensor 220. When the output from the magnetic sensor 220 due to the modulated calibration signal matches the expected result, the system 200 is properly calibrated.

Figure 3:
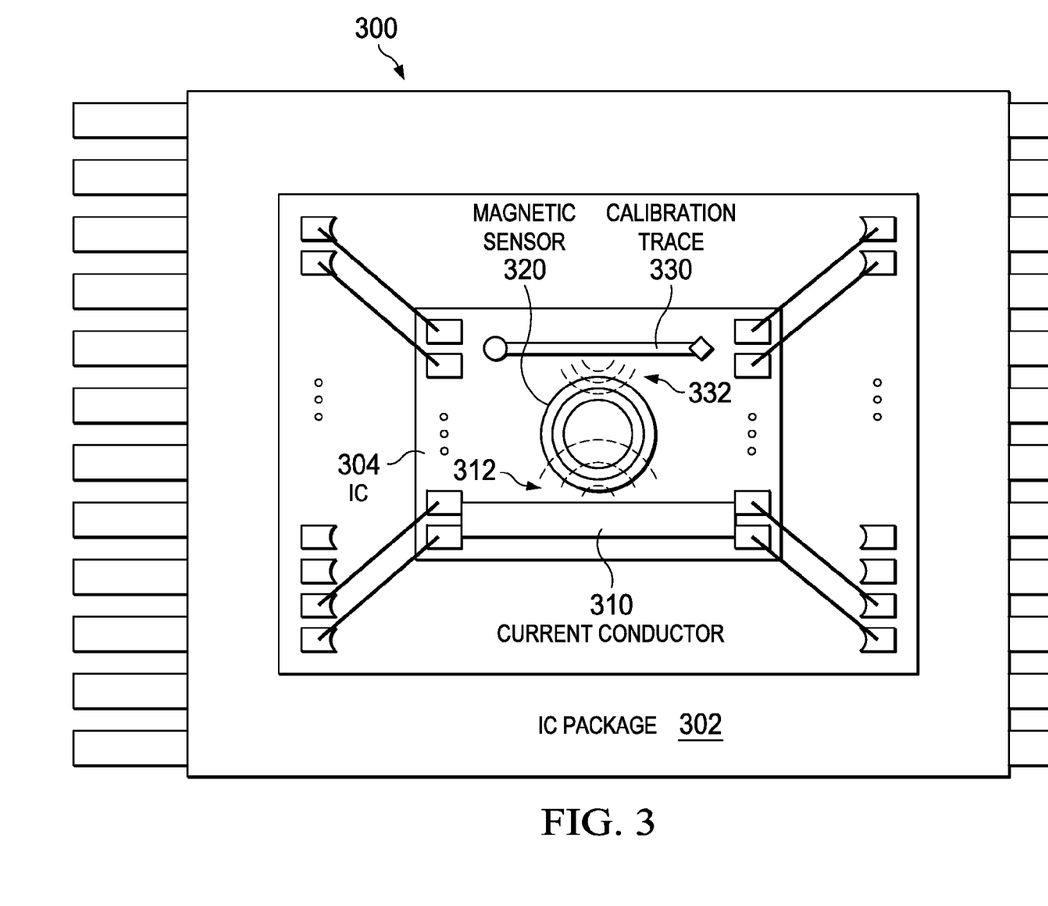
FIG. 3 depicts in another block diagram an example arrangement of the present application including a magnetic sensor disposed within an integrated circuit package with the current conductor integrated on the integrated circuit.

FIG. 3 depicts another example arrangement of the present application. In this illustrative and non-limiting example, the magnetic sensor 320 is disposed within an IC package 302 with the current conductor integrated on the IC 304. In system 300, an IC package 302 contains an IC 304. Within the IC 304 are a magnetic sensor 320, a calibration trace 330 which produces magnetic field 332, and a current conductor 310 which produces magnetic field 312. Not shown in FIG. 3 for simplicity but also integrated within the IC 304 are the associated components from FIG. 1, the calibration sub-system including the modulator, calibration trace, and current source, a demodulation filter, a comparator, and amplifier with gain adjust.

In the example arrangement 300 of FIG. 3, the integration of the calibration trace 330 and the magnetic sensor 320 fixes the spatial distance between them which ensures that the magnetic field 332 generated by the calibration trace is consistent and that variations observed in the calibration output signal from the magnetic sensor 320 are due to external influences described above, such as temperature and aging, and not from any variance in the distance between the two components. Further, integrating the current carrying conductor 310 on the IC fixes the distance between the conductor 330 and the magnetic sensor 320 so that variations in its magnetic field strength will be a combination of changes in the current plus environmental changes in the sensor itself such as temperature and aging. The calibration methods described above with respect to FIG. 1 can then again be used to calibrate the system 300 while it is in use, or, "in-system", using the calibration trace and the modulation and de-modulation circuitry of FIG. 1. Calibration can be performed continuously, or on a periodic basis, even while the system is outputting a measure of the magnetic field from the conductor 330. In another alternative arrangement, the current conductor 310 can be arranged perpendicularly to the calibration trace 330, or otherwise positioned. The current conductor 310 and the calibration trace 330 have to be electrically isolated which can be accomplished using multiple level metal and inter metal dielectric materials, such as are typically used in forming an integrated circuit, for example.

Figure 4:
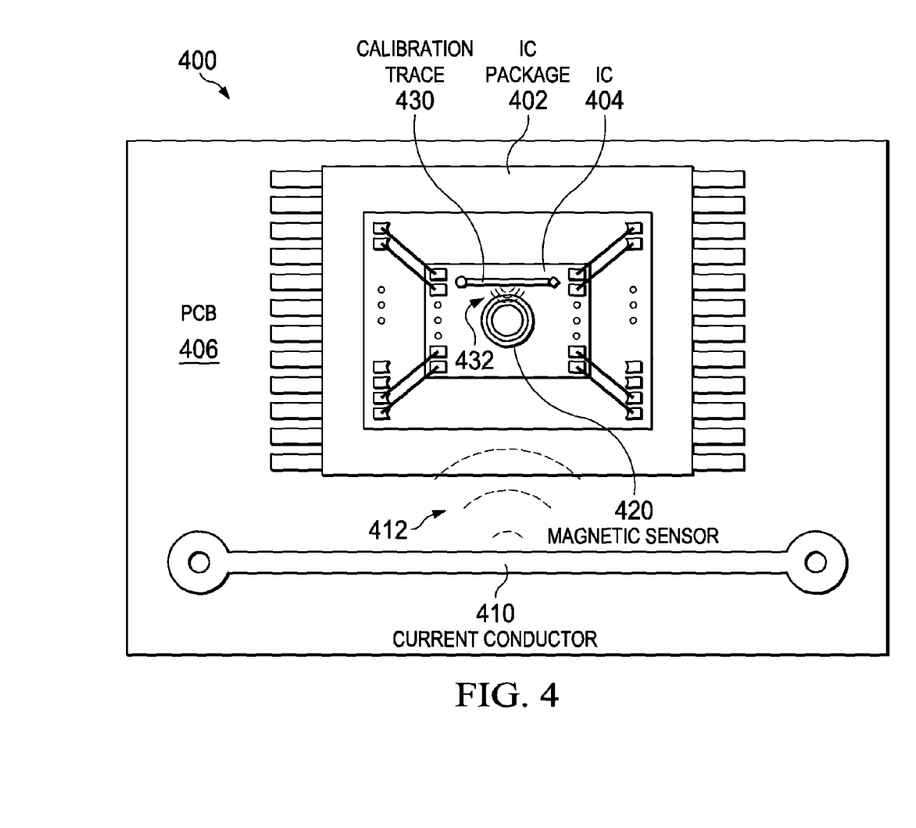
FIG. 4 depicts in a further block diagram an example arrangement of the present application including a magnetic sensor arranged on an integrated circuit with an external current conductor.

FIG. 4 depicts in another example arrangement of the present application an external current conductor arranged with a magnetic sensor. In example 400, an IC package 402 contains an IC 404 and can be mounted on a circuit board 406, for example. Within the IC 404 are a magnetic sensor 420 and a calibration trace 430 which produces magnetic field 432. A current conductor 410 which produces magnetic field 412 is provided totally external to the IC and external to the package. It could be mounted on the printed circuit board (PCB) 406 or the conductor can be totally independent of the PCB. Not shown in FIG. 4, but integrated within the IC are the associated calibration components from FIG. 1, including the calibration sub-system of a current source and modulator, a demodulation filter, differential comparator, sensitivity adjust and an amplifier with gain adjust.

In example 400 shown in FIG. 4, the integration of the calibration trace 430 and the magnetic sensor 420 again fix the spatial distance between them. Further, integrating the current conductor 410 on the PCB 406 fixes the distance between the conductor 430 and the magnetic sensor 420 so that variations in its magnetic field strength will be a combination of changes in the current plus environmental changes in the sensor itself such as temperature and aging. In the case where the current conductor 410 is external to the PCB, such as on a power line or bus bar, the calibration sub-system will still detect and filter out any environmental effects on the magnetic sensor through the calibration process described above.

Figure 5:
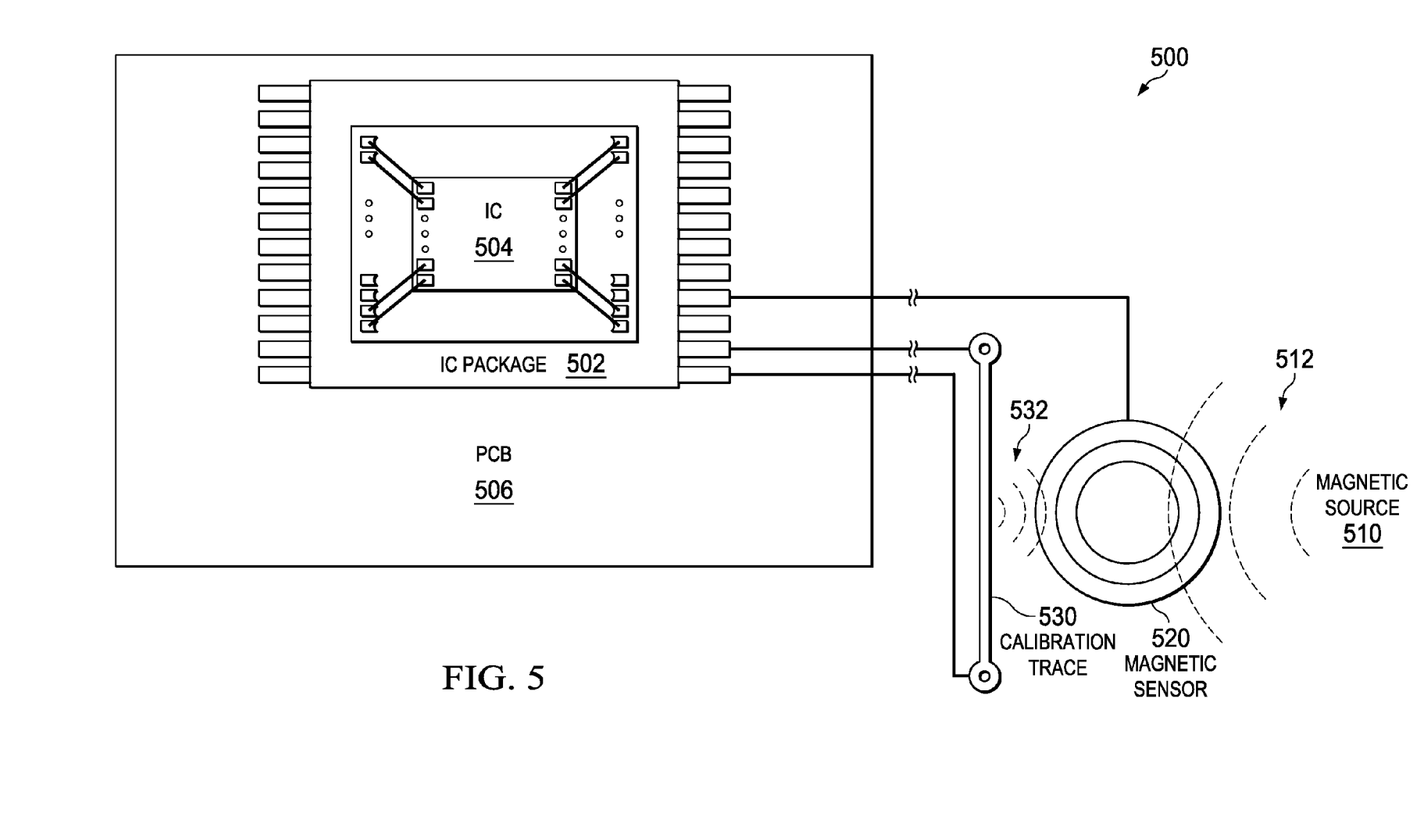
FIG. 5 depicts in another block diagram yet another example arrangement of the present application with an external calibration trace and external magnetic sensor.

FIG. 5 depicts another example of the present application with an external calibration trace. In example 500, an IC package 502 contains an IC 504 and is mounted on a PCB 506. Integrated within the IC, but not shown, are the associated components from FIG. 1, calibration current source, calibration modulator, demodulation filter, differential block and amplifier with gain adjust. In this example, there is a magnetic sensor 520 and calibration trace 530 which produces magnetic field 532. A magnetic source 510 which produces magnetic field 512 is totally external to the IC and external to the package. Additionally, a calibration trace 530 is mounted near the magnetic sensor 520 such that the calibration magnetic field 532 is sensed by the magnetic sensor 520.

In situations where standalone magnetic sensors are desired for use or in systems where the sensors already exist, such as sensor 520, a separate calibration trace 530 may be deployed near the existing sensor with the control circuitry being located on the IC 504. Once the calibration trace is fixed in place, the continuous calibration of the external sensor can be employed through the use of the calibration sub-system on IC 504 and including the external calibration trace 530. This arrangement advantageously allows the novel calibration approaches of the present application to be applied in existing systems using magnetic sensors with slight modification and at a low cost.

Figure 6:
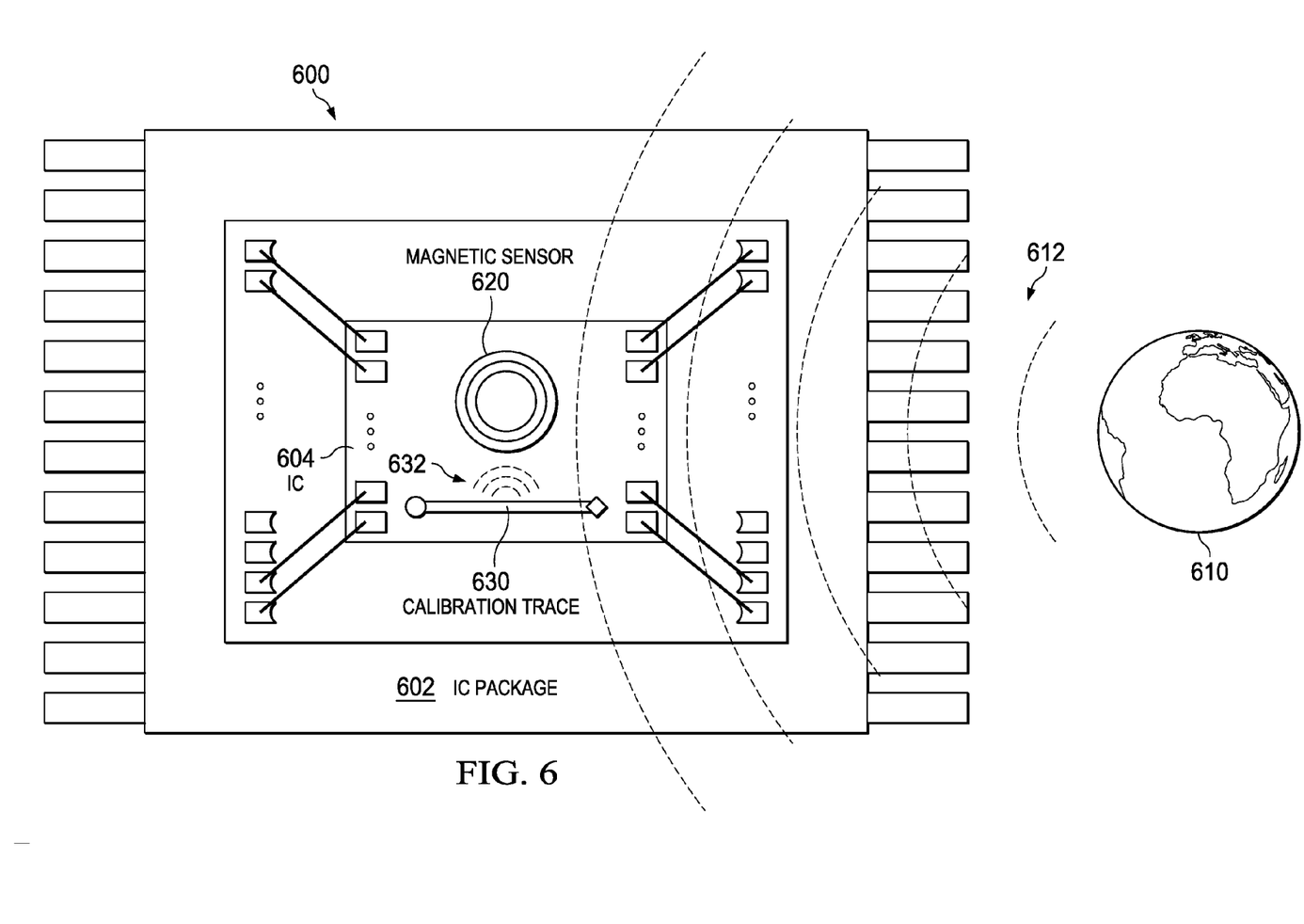
FIG. 6 depicts in another block diagram another example arrangement of the present application of an IC package containing a magnetic sensor with the current conductor integrated in the package for sensing an external magnetic field.

FIG. 6 illustrates another in another example arrangement of the present application an IC package with a calibration trace integrated in the package and sensing an external magnetic field. In system 600, an IC package 602 contains an IC 604. External to the package is a magnetic field 612 depicting, in this non-limiting example, the earth 610 as the magnetic source. Within the IC is a magnetic sensor 620 and calibration trace 630 which produces magnetic field 632. Not shown in FIG. 6, but integrated within the IC are the associated components from FIG. 1, the calibration sub-system, demodulation filter, comparator and amplifier with gain adjust and/or a sensitivity adjustment.

In the example system 600 of FIG. 6, the integration of the calibration trace 630 and the magnetic sensor 620 again fix the spatial distance between the elements. In this example, which can be used for an application such as an electronic compass, off-line position sensor, or other such navigational aid, as the magnetic sensor is moved the magnetic field 612 varies and is detected by the magnetic sensor 620. With the continuous calibration of the magnetic sensor running, changes in the sensor due to environmental conditions (temperature, age, etc.) can be compensated for to maintain the accuracy of the system.

Figure 7:
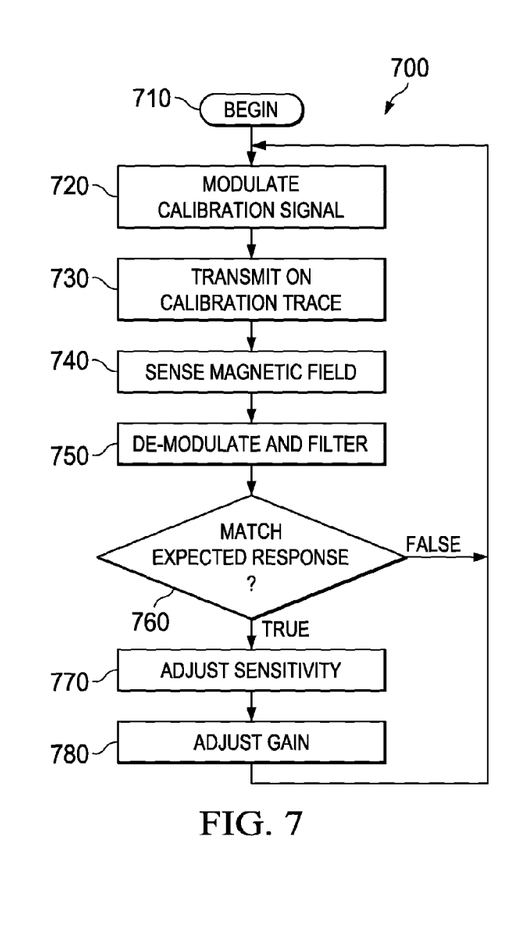
FIG. 7 illustrates in a flow diagram an example arrangement for a method of calibrating a magnetic sensor.

FIG. 7 illustrates, in a flow diagram, an example method arrangement illustrating an additional aspect of the present application. In FIG. 7, calibration of a magnetic sensor is performed using a calibration trace and modulation.

In FIG. 7, the method begins at step 710. In step 720, the modulator is used to create a modulated calibration signal. As described above with respect to FIG. 1, the modulation is performed to distinguish the magnetic field from the calibration system from the background magnetic field being sensed by the system. Sine wave, cosine wave, square wave pulses or simple on off modulation can be used.

At step 730, the modulated signal is applied to the calibration trace, resulting in a modulated magnetic field signal. At step 740, the output of the magnetic sensor is observed, so that the corresponding sensed magnetic field can be measured. At this point the modulated signal is combined with the output of the magnetic sensor due to the background magnetic field. In step 750, the de-modulation and filtering steps are applied to isolate the output due to the calibration signal from output due to the background magnetic field.

Step 760 compares the response from the magnetic sensors to the calibration magnetic field to an expected response, which can be stored in a memory and retrieved, for example. Non-volatile memory such as FLASH, EEPROM, EPROM, PROM and the like can be used to store the expected response, which can be generated using simulation tools, or captured from a known good system or from the current system at a known good operating condition.

If the expected response matches the response from the system, the method returns to the beginning step, 710. In some arrangements of the present application, the method can be performed continuously. Alternatively, the method can be performed on some periodic basis as determined by a system designer or user. For example, the method can be performed on some time basis, or at a reset or power up, or with some other event such as a change in temperature.

If at step 760 the expected response does not match the output from the magnetic sensor, the method continues to step 770, which can adjust the sensitivity of the sensor, if desired, and step 780, which can adjust the gain to the amplifier. Once these adjustments are made, the calibration method 700 begins again and this continues until the expected response at step 760 matches the output of the sensor; thus the system calibrates the sensor.

In one example arrangement, a system includes a magnetic sensor configured to output a signal corresponding to input magnetic fields; a calibration trace disposed proximal to the magnetic sensor; a controlled current source coupled to the calibration trace and configured to output a current resulting in a magnetic field output from the calibration trace; and a comparator coupled to the output signal from the magnetic sensor and to an expected signal; wherein the comparator outputs a signal indicating whether the output signal from the magnetic sensor corresponds to the expected signal.

In a further arrangement, in the system described above, the system further includes a modulator coupled between the controlled current source and the calibration trace and configured to output a modulated signal onto the calibration trace; and a demodulator coupled between the output of the magnetic sensor and the comparator, configured to isolate a portion of the output signal corresponding to the modulated signal on the calibration trace.

In another arrangement, the system described is provided wherein the magnetic sensor further includes at least one fluxgate sensor. In an additional alternative arrangement, the magnetic sensor further comprises a second fluxgate sensor disposed proximal to and spaced from the at least one fluxgate sensor.

In a further alternative arrangement, in the system described above, the magnetic sensor further comprises at least one Hall Effect sensor. In yet another arrangement, in the system described above, the magnetic sensor further comprises a second Hall Effect sensor proximal to and spaced from the at least one Hall Effect sensor.

In still another arrangement, in the system described above, the system further includes a measurement current conductor spaced from the magnetic sensor and configured to output a magnetic field corresponding to a current from a signal to be measured.

In still another arrangement, in the system described above, wherein the magnetic sensor, the calibration trace, and the measurement current conductor are disposed within an integrated circuit package.

In still another arrangement, in the system described above, the magnetic sensor and the calibration trace are disposed on a single integrated circuit.

In another example arrangement that forms an additional aspect of the present application, an integrated circuit includes a magnetic sensor configured to output a signal in response to a magnetic field; a calibration trace disposed proximal to the magnetic sensor and configured to output a magnetic field corresponding to a current applied to the calibration trace; a modulator coupled to the calibration trace configured to output a modulated signal to the calibration trace; a demodulator coupled to the output signal of the magnetic sensor, configured to isolate a portion of the output signal corresponding to the modulated signal; and a comparator coupled to the demodulator and to an expected output signal, configured to output a signal indicating whether the demodulated output signal matches the expected output signal.

In still a further arrangement, the integrated circuit described above further includes a current conductor disposed on the integrated circuit, the current conductor configured to output a magnetic field corresponding to a current on a signal being measured.

In yet another alternative arrangement, the integrated circuit described above is provided wherein the current conductor and the calibration trace are arranged in parallel. In still another arrangement, in the integrated circuit described above the current conductor and the calibration trace are arranged perpendicularly.

In another alternative arrangement, the integrated circuit described above is provided wherein the magnetic sensor further comprises at least one fluxgate sensor. In a further alternative arrangement, the integrated circuit described above is provided and the magnetic sensor further comprises at least a second fluxgate sensor disposed proximal to and spaced from the at least one fluxgate sensor.

In yet another alternative arrangement, in the integrated circuit described above, the magnetic sensor further comprises at least two magnetic sensors proximal to and spaced from one another.

In another alternative arrangement that forms an additional aspect of the present application, a method includes providing a magnetic sensor configured to output a signal corresponding to a magnetic field; providing a calibration trace proximal to the magnetic sensor; applying a modulated current to the calibration trace to produce a magnetic field corresponding to the modulated current; demodulating the output signal from the magnetic sensor; comparing the output signal to an expected output signal; and responsive to the comparing, adjusting the magnetic sensor to adjust the output signal.

In a further alternative arrangement, the above described method is performed and adjusting the magnetic sensor further includes adjusting a sensitivity input to the magnetic sensor. In still another arrangement, the above described method is performed and adjusting the magnetic sensor further comprises adjusting a gain of the output signal of the magnetic sensor.

In still another alternative arrangement, the above described method is performed, and further includes iteratively repeating the steps of applying a modulated current, demodulating the output signal, comparing the output signal to an expected output signal, and adjusting the magnetic sensor to adjust the output signal until the comparing indicates a match between the output signal and the expected output signal.

Various modifications can also be made in the order of steps and in the number of steps to form additional novel arrangements that incorporate aspects of the present application, and these modifications will form additional alternative arrangements that are contemplated by the inventors as part of the present application and which fall within the scope of the appended claims.

Although the example illustrative arrangements have been described in detail, it should be understood that various changes, substitutions and alterations can be made herein without departing from the spirit and scope of the present application as defined by the appended claims.

Moreover, the scope of the present application is not intended to be limited to the particular illustrative example arrangement of the process, machine, manufacture, and composition of matter means, methods and steps described in this specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding example arrangements described herein may be utilized according to the illustrative arrangements presented and alternative arrangements described, suggested or disclosed. Accordingly, the appended claims are intended to include within their scope such processes, machines, manufacture, compositions of matter, means, methods, or steps.

What is claimed is:

1. A system, comprising:
   a magnetic sensor configured to output a signal corresponding to magnetic field;
   a calibration trace disposed proximal to the magnetic sensor;
   a controlled current source coupled to the calibration trace and configured to output a current resulting in a magnetic field output from the calibration trace; and
   a comparator coupled to the output signal from the magnetic sensor and to an expected signal;
   wherein the comparator outputs a signal indicating whether the output signal from the magnetic sensor corresponds to the expected signal.

2. The system of claim 1, and further comprising:
   a modulator coupled between the controlled current source and the calibration trace and configured to output a modulated signal onto the calibration trace; and
   a demodulator coupled between the output of the magnetic sensor and the comparator, configured to isolate a portion of the output signal corresponding to the modulated signal on the calibration trace.

3. The system of claim 1, wherein the magnetic sensor further comprises at least one magnetic sensor that is one selected from the group consisting essentially of a Hall Effect sensor, a fluxgate sensor, an AMR sensor, an EMR sensor, a GMR sensor, and a TMR sensor.

4. The system of claim 1, wherein the magnetic sensor further comprises at least one fluxgate sensor.

5. The system of claim 4, wherein the magnetic sensor further comprises a second fluxgate sensor disposed proximal to and spaced from the at least one fluxgate sensor.

6. The system of claim 1, wherein the magnetic sensor further comprises at least one Hall Effect sensor.

7. The system of claim 6, wherein the magnetic sensor further comprises a second Hall Effect sensor proximal to and spaced from the at least one Hall effect sensor.

8. The system of claim 1, further comprising a measurement current conductor spaced from the magnetic sensor and configured to output a magnetic field corresponding to a current from a signal to be measured.

9. The system of claim 8 wherein the magnetic sensor, the calibration trace, and the measurement current conductor are disposed within an integrated circuit package.

10. The system of claim 1 wherein the magnetic sensor and the calibration trace are disposed on a single integrated circuit.

11. An integrated circuit, comprising:
    a magnetic sensor configured to output a signal in response to a magnetic field;
    a calibration trace disposed proximal to the magnetic sensor and configured to output a magnetic field corresponding to a current applied to the calibration trace;
    a modulator coupled to the calibration trace configured to output a modulated signal to the calibration trace;
    a demodulator coupled to the output signal of the magnetic sensor, configured to isolate a portion of the output signal corresponding to the modulated signal; and a comparator coupled to the demodulator and to an expected output signal, configured to output a signal indicating whether the demodulated output signal matches the expected output signal.

12. The integrated circuit of claim 11 and further comprising a current conductor disposed on the integrated circuit, the current conductor configured to output a magnetic field corresponding to a current on a signal being measured.

13. The integrated circuit of claim 12 wherein the current conductor and the calibration trace are arranged in parallel.

14. The integrated circuit of claim 12 wherein the current conductor and the calibration trace are arranged perpendicularly.

15. The integrated circuit of claim 11 wherein the magnetic sensor further comprises at least one fluxgate sensor.

16. The integrated circuit of claim 15 wherein the magnetic sensor further comprises at least a second fluxgate sensor disposed proximal to and spaced from the at least one fluxgate sensor.

17. The integrated circuit of claim 11 wherein the magnetic sensor further comprises at least two magnetic sensors proximal to and spaced from one another.

18. A method, comprising:
providing a magnetic sensor configured to output a signal corresponding to a magnetic field;
providing a calibration trace proximal to the magnetic sensor;
applying a modulated current to the calibration trace to produce a magnetic field corresponding to the modulated current;
demodulating the output signal from the magnetic sensor;
comparing the output signal to an expected output signal; and
responsive to the comparing, adjusting the magnetic sensor to adjust the output signal.

19. The method of claim 18, wherein adjusting the magnetic sensor further comprises adjusting a sensitivity input to the magnetic sensor.

20. The method of claim 19, wherein adjusting the magnetic sensor further comprises adjusting a gain of the output signal of the magnetic sensor.

21. The method of claim 18, and further comprising iteratively repeating the steps of applying a modulated current, demodulating the output signal, comparing the output signal to an expected output signal, and adjusting the magnetic sensor to adjust the output signal until the comparing indicates a match between the output signal and the expected output signal.

* * * * *